(12) United States Patent
Booth, Jr. et al.

(10) Patent No.: US 8,481,397 B2
(45) Date of Patent: Jul. 9, 2013

(54) POLYSILICON RESISTOR AND E-FUSE FOR INTEGRATION WITH METAL GATE AND HIGH-K DIELECTRIC

(75) Inventors: Roger A. Booth, Jr., Wappingers Falls, NY (US); Kangguo Cheng, Guilderland, NY (US); Rainer Loesing, Newburgh, NY (US); Chengwen Pei, Danbury, CT (US); Xiaojun Yu, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 480 days.

(21) Appl. No.: 12/719,289

(22) Filed: Mar. 8, 2010

(65) Prior Publication Data

US 2011/0215321 A1 Sep. 8, 2011

(51) Int. Cl.
*H01L 21/20* (2006.01)

(52) U.S. Cl.
USPC .................. 438/383; 438/601; 257/E21.363

(58) Field of Classification Search
USPC .. 438/382–383, 238, 281, 601; 257/E21.004, 257/E21.363
See application file for complete search history.

(56) References Cited

U.S. PATENT DOCUMENTS

| | | | |
|---|---|---|---|
| 5,554,873 A * | 9/1996 | Erdeljac et al. | 257/E21.004 |
| 8,159,040 B2 * | 4/2012 | Coolbaugh et al. | 257/530 |
| 2008/0029843 A1 | 2/2008 | Booth, Jr. et al. | |
| 2008/0050873 A1 | 2/2008 | Cheng et al. | |
| 2008/0050903 A1 | 2/2008 | Booth, Jr. et al. | |
| 2009/0108356 A1 | 4/2009 | Cheng et al. | |
| 2009/0148986 A1 | 6/2009 | Cheng et al. | |
| 2009/0206416 A1 | 8/2009 | Cheng et al. | |
| 2009/0321853 A1 | 12/2009 | Cheng et al. | |
| 2010/0013026 A1 | 1/2010 | Booth, Jr. et al. | |
| 2010/0019328 A1 * | 1/2010 | Zhang et al. | 257/E21.004 |
| 2010/0059823 A1 * | 3/2010 | Chung et al. | 257/355 |
| 2010/0148262 A1 * | 6/2010 | Stahrenberg et al. | 438/238 |

* cited by examiner

*Primary Examiner* — Matthew Landau
*Assistant Examiner* — Sun M Kim
(74) *Attorney, Agent, or Firm* — Yuanmin Cai; Howard M. Cohn

(57) ABSTRACT

A method is provided for making a resistive polycrystalline semiconductor device, e.g., a poly resistor of a microelectronic element such as a semiconductor integrated circuit. The method can include: (a) forming a layered stack including a dielectric layer contacting a surface of a monocrystalline semiconductor region of a substrate, a metal gate layer overlying the dielectric layer, a first polycrystalline semiconductor region adjacent the metal gate layer having a predominant dopant type of either n or p, and a second polycrystalline semiconductor region spaced from the metal gate layer by the first polycrystalline semiconductor region and adjoining the first polycrystalline semiconductor region; and (b) forming first and second contacts in conductive communication with the second polycrystalline semiconductor region, the first and second contacts being spaced apart so as to achieve a desired resistance. In a variation thereof, an electrical fuse is formed which includes a continuous silicide region through which a current can be passed to blow the fuse. Some of the steps of fabricating the poly resistor or the electrical fuse can be employed simultaneously in fabricating metal gate field effect transistors (FETs) on the same substrate.

16 Claims, 6 Drawing Sheets

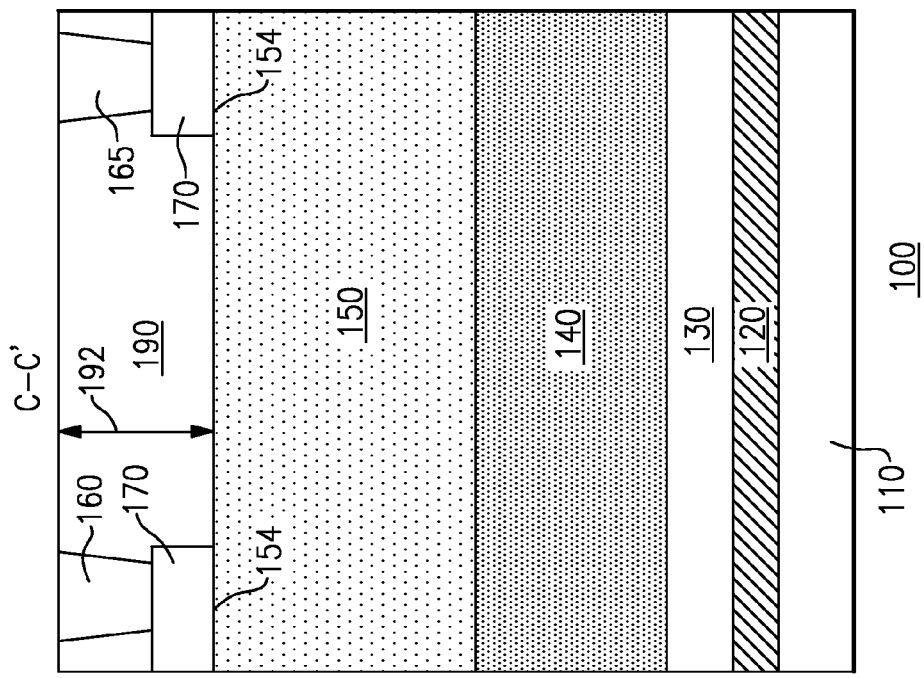
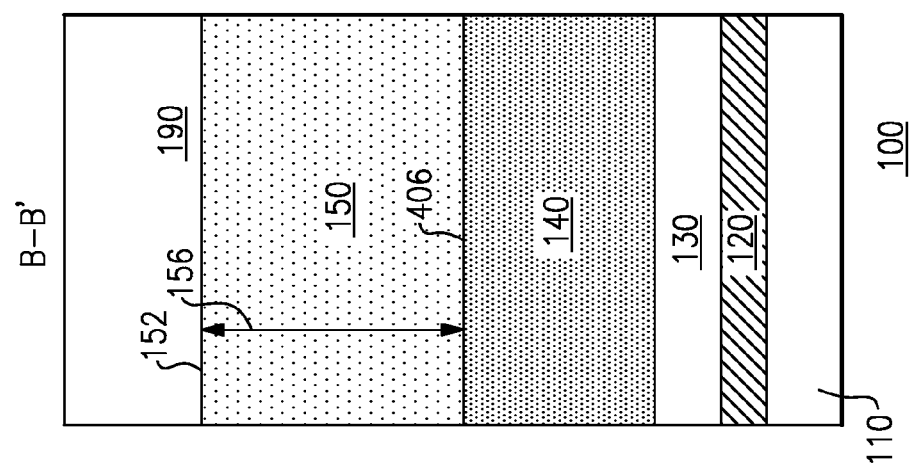
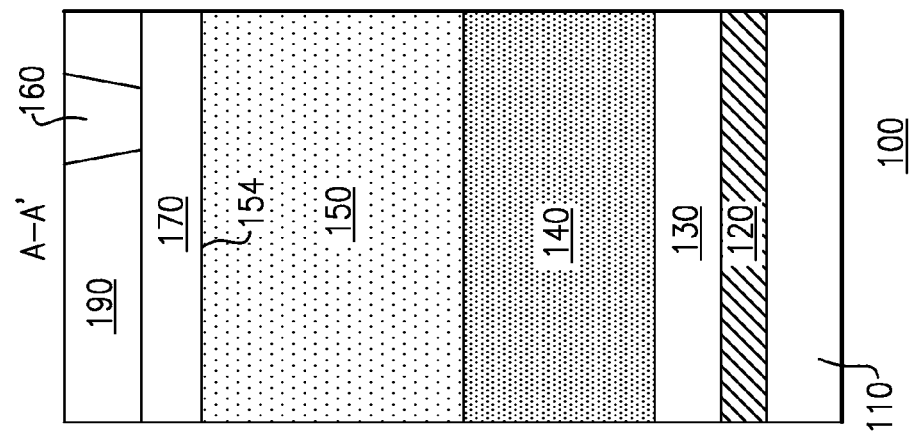

POLYSILICON RESISTOR AND E-FUSE FOR INTEGRATION WITH METAL GATE AND HIGH-K DIELECTRIC

BACKGROUND OF THE INVENTION

The present invention relates to semiconductor integrated circuits and their manufacture, and more specifically to structures and methods of making a polysilicon resistor or electrical fuse of an integrated circuit.

The technology trend has been to reduce the size of semiconductor devices and increase the speed of operation. As the required speed of operation increases, high dielectric constant (high-k) materials are being considered for use as the gate dielectric and metal gates are being considered for devices. These materials can help achieve goals for speed of operation in semiconductor integrated circuits (ICs) or "chips" and higher level components and systems in which the chips can be used.

Polysilicon resistors can be manufactured on chips in small size and with acceptable resistance. However, in logic chips such as complementary metal-oxide-semiconductor (CMOS) chips, the fabrication of polysilicon resistors with transistors having high-k gate dielectric and metal gate materials has created certain design challenges. To reduce manufacturing steps and costs, polysilicon resistors and polysilicon gates of transistors on the chip have traditionally been formed simultaneously using many processing steps in common. However, when a polysilicon resistor is fabricated in a structure which includes a metal gate layer, the traditional methods can raise concerns due to the presence of a conducting metal layer under the polysilicon layer.

Similar concerns are associated with the manufacturing of electrical fuses (e-fuses). E-fuses have been used in chips in recent years because they can permit a chip to be reprogrammed even after the chip has been manufactured, packaged, and possibly installed in a higher level assembly or system. Unfortunately, like polysilicon resistors, the fabrication of e-fuses in chips which have metal gate layers and high-k materials can add complexity or manufacturing costs or steps to the fabrication process.

Consequently, there is a need for improved structures and methods of fabricating polysilicon resistors and e-fuses in chips in conjunction with the simultaneous fabrication of transistors having high-K gate dielectrics and metal gates.

SUMMARY OF THE INVENTION

According to an embodiment of the invention, a method is provided of making a resistive polycrystalline semiconductor device of a microelectronic element such as an integrated circuit. Such method can include forming a layered stack including a dielectric layer contacting a surface of a monocrystalline semiconductor region of a substrate. The layered stack can include a metal gate layer overlying the dielectric layer, a first polycrystalline semiconductor region adjacent the metal gate layer, and a second polycrystalline semiconductor region spaced from the metal gate layer by the first polycrystalline semiconductor region and adjoining the first polycrystalline semiconductor region. The first polycrystalline semiconductor region can have a first predominant dopant type being either p or n, and a second polycrystalline semiconductor region can have a second predominant dopant type which can be either p or n and opposite the first predominant dopant type. First and second contacts can be formed in conductive communication with the second polycrystalline semiconductor region, the first and second contacts being spaced apart so as to achieve a desired resistance.

In accordance with another embodiment of the invention, a resistive polycrystalline semiconductor device or poly resistor of a microelectronic element is provided. In such embodiment, the poly resistor can include a layered stack including a dielectric layer contacting a surface of a monocrystalline semiconductor region of a substrate, a metal gate layer overlying the dielectric layer, and a polycrystalline semiconductor region overlying the metal gate layer. The polycrystalline semiconductor region can include a first polycrystalline semiconductor region adjacent the metal gate layer, and a second polycrystalline semiconductor region spaced from the metal gate layer by the first polycrystalline semiconductor region and adjoining the first polycrystalline semiconductor region. The first polycrystalline semiconductor region can have a first predominant dopant type being either p or n, and a second polycrystalline semiconductor region can have a second predominant dopant type being either p or n and being opposite the first predominant dopant type. The poly resistor can have first and second contacts in conductive communication with the second polycrystalline semiconductor region, the first and second contacts being spaced apart so as to achieve a desired resistance.

In accordance with another embodiment of the invention, a method is provided of making an electrical fuse element of a microelectronic element. Such method can include forming a layered stack. The layered stack can include a dielectric layer contacting a surface of a monocrystalline semiconductor region of a substrate, a metal gate layer overlying the dielectric layer, a first polycrystalline semiconductor region adjacent the metal gate layer, and a second polycrystalline semiconductor region spaced from the metal gate layer by the first polycrystalline semiconductor region and adjoining the first polycrystalline semiconductor region. The first polycrystalline semiconductor region can have a first predominant dopant type being either p or n, and the second polycrystalline semiconductor region can have a second predominant dopant type being either p or n and being opposite from the first predominant dopant type. The layered stack can further include a silicide region extending over at least a portion of the second polycrystalline semiconductor region. First and second spaced-apart contacts can be formed in conductive communication with the silicide region. At least a portion of the silicide region can extend continuously between the first and second contacts and can be electrically connected with each of first and second contacts.

In accordance with another embodiment of the invention, an electrical fuse element of a microelectronic element is provided. The electrical fuse can include a layered stack. The layered stack can include a dielectric layer contacting a surface of a monocrystalline semiconductor region of a substrate, a metal gate layer overlying the dielectric layer, and a polycrystalline semiconductor region overlying the metal gate layer. The polycrystalline semiconductor region can include a first polycrystalline semiconductor region adjacent the metal gate layer, and a second polycrystalline semiconductor region spaced from the metal gate layer by the first polycrystalline semiconductor region and adjoining the first polycrystalline semiconductor region. The first polycrystalline semiconductor region can have a first predominant dopant type being either p or n, and the second polycrystalline semiconductor region can have a second predominant dopant type being either p or n and being opposite from the first predominant dopant type. The layered stack can further include a silicide region overlying the second polycrystalline semiconductor region. The electrical fuse can include first and second spaced-apart contacts, wherein at least a portion of the silicide region extends continuously between the first and second contacts and is electrically connected with each of first and second contacts.

In a particular embodiment, some of the steps of fabricating the poly resistor or the electrical fuse can be employed simultaneously in fabricating metal gate field effect transistors (FETs) on the same substrate.

BRIEF DESCRIPTION OF THE DRAWINGS

FIG. 2A is a sectional view of the polysilicon resistor through line A-A' of FIG. 1.

FIG. 2B is a sectional view of the polysilicon resistor through line B-B' of FIG. 1.

FIG. 2C is a sectional view of the polysilicon resistor through line C-C' of FIG. 1.

DETAILED DESCRIPTION

Figure 1:
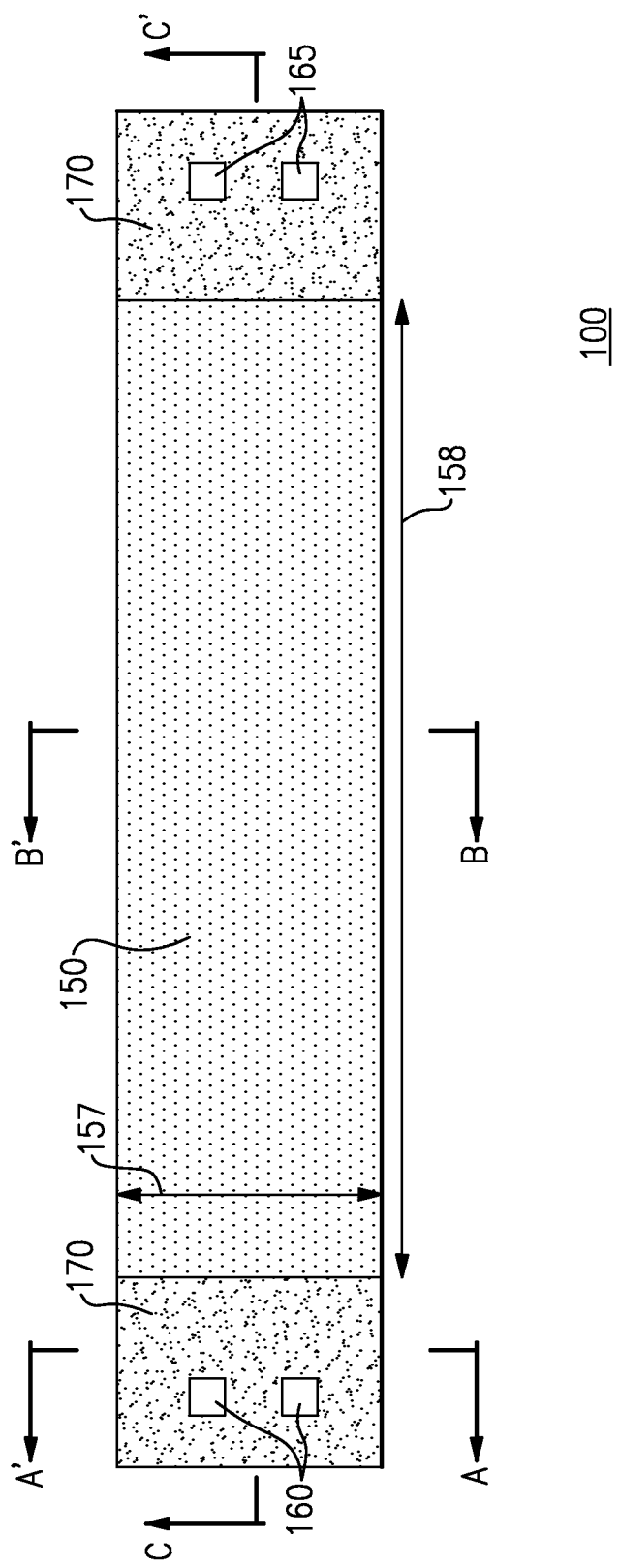
FIG. 1 is a plan view illustrating a polysilicon resistor in accordance with an embodiment of the invention.

FIGS. 1, 2A, 2B and 2C are a top-down plan view and a corresponding sectional views, respectively, illustrating a polycrystalline semiconductor resistor 100 or "poly resistor" in accordance with an embodiment of the invention. As illustrated in the plan view of FIG. 1, the poly resistor 100 is a resistive polycrystalline semiconductor device which can be part of a microelectronic element such as a semiconductor chip or semiconductor wafer having an integrated circuit thereon. The poly resistor can be formed in such semiconductor wafer simultaneously with other semiconductor devices, for example without limitation, field effect transistors. The poly resistor can include a layered stack of materials. One layer 150 of the stack is polycrystalline semiconductor material or "poly" doped predominantly n-type, and silicide contacts, e.g., electrodes 170. In turn, the silicide electrodes 170 are electrically connected with other circuit elements of a chip by way of conductive vias 160, 165 which electrically contact them through a dielectric layer (not shown), such as an interlevel dielectric (ILD) layer. The n-doped poly layer can be disposed atop and in contact with a poly layer 140 adjacent to a metal gate layer 130 to form a p-n junction 406 at a boundary between regions 140, 150. The metal gate layer and a high-K gate dielectric layer 120 underlying the metal gate layer can be disposed atop an insulating region 110 of a semiconductor substrate, e.g., a chip or wafer. In one embodiment, the insulating region can be a shallow trench isolation (STI) region of the semiconductor substrate.

A resistance of the poly resistor 100 can be determined primarily by the n-type dopant concentration of the n-doped region 150, a thickness 156 (FIG. 2B) of the n-doped polycrystalline semiconductor region 150 above a p-n junction 406 of the layered structure, as well as a width 157 of the region 150 and a length 158 of the region 150 between the electrodes 170. In one embodiment, the metal gate layer 120 need not be electrically connected to an external source of potential so that the electric potential on the metal gate layer 120 is allowed to float. Alternatively, the metal gate layer 120 can be electrically clamped to a suitable low source of potential such as ground or a substrate bias voltage. In that way, the structure including the electrodes 170 disposed above the n-doped poly layer 150, which in turn is disposed above the p-doped layer 140 and the metal gate layer, provides a p-n junction structure which is reverse-biased with respect to the electrodes 170 for at least voltages above the ground or substrate bias voltage at which the metal gate is clamped.

Figure 3:
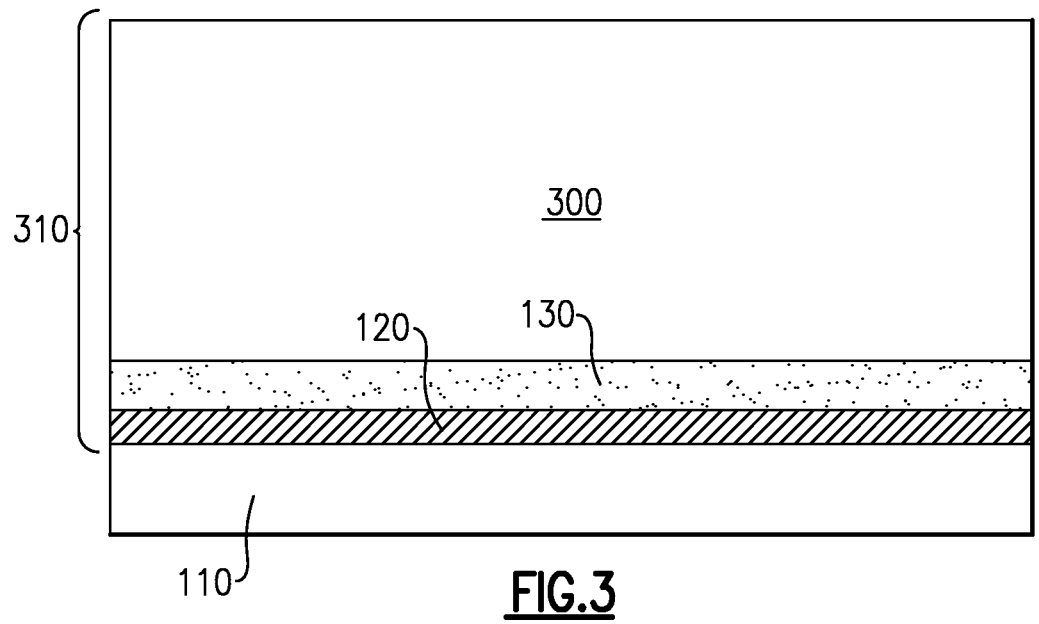
FIG. 3 is a sectional view illustrating a stage in a method of fabricating a polysilicon resistor in accordance with an embodiment of the invention.

Referring to FIG. 3, a method of making a resistive polycrystalline semiconductor device of a microelectronic element, e.g., a wafer or chip, will now be described. FIG. 3 illustrates a preliminary stage of fabrication in which a layered stack 310 is disposed atop an insulating region 110 of a semiconductor substrate, e.g., a semiconductor wafer. The layered stack can include a gate dielectric layer, for example, a high-K gate dielectric layer 120 which includes a high dielectric constant dielectric material. The layered stack can also include a metal gate layer 130 overlying the gate dielectric layer can include an elemental metal, and a layer 300 of polycrystalline semiconductor material. The semiconductor layer 300 can include polysilicon, for example, can be intrinsic, or can be not intentionally doped, or can be lightly doped. In one embodiment, the poly layer 300 can have a dopant concentration of less than or equal to about $10^{14}$ cm$^{-3}$. The poly layer 300 can be deposited onto the metal gate layer 120. The layered stack can be formed at the same time that the same layers 120, 130, 300 therein are deposited over a monocrystalline semiconductor region (not shown) of the substrate for subsequent patterning into gates of transistors provided in the semiconductor substrate.

Figure 4:
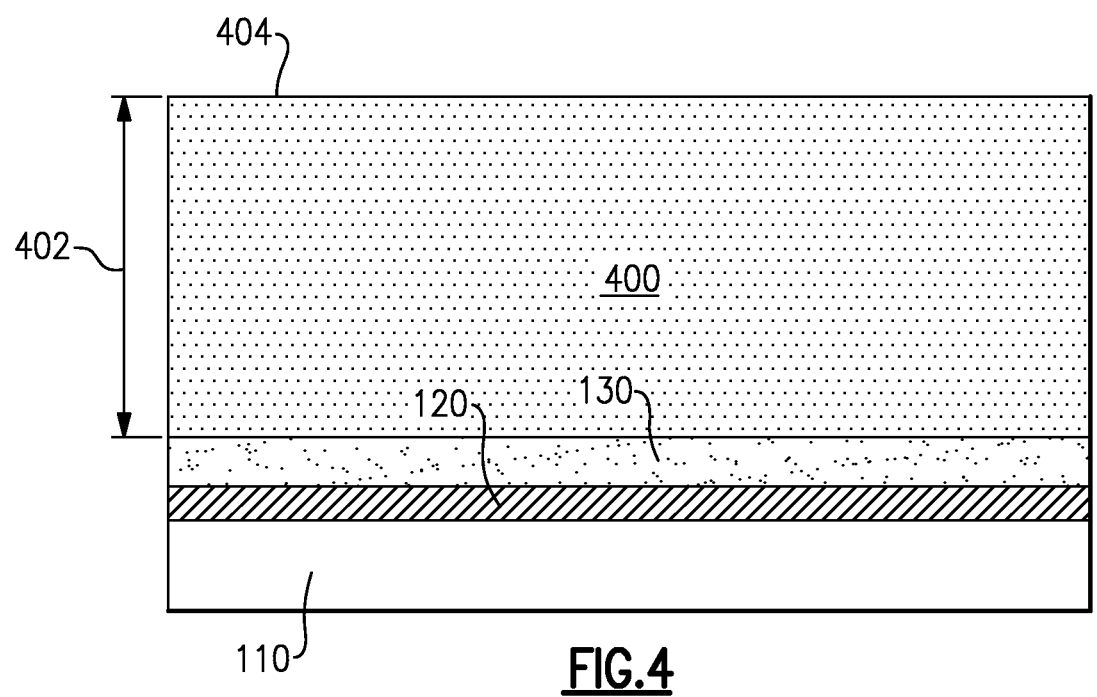
FIG. 4 is a sectional view illustrating a stage subsequent to that shown in FIG. 3 in a method of fabricating a polysilicon resistor in accordance with an embodiment of the invention.

Then, a process is employed for doping the poly layer 300 to form a p-type doped layer 400 (FIG. 4). In one embodiment, ion implantation is used to implant boron into the poly layer under the following conditions. The poly layer 400 can be 700 angstroms in thickness 402 from a top surface 404 thereof to the metal gate 130. The energy can be 0.5 to 3 kilo-electron-volts (KeV) and the dose can be $1.5 \times 10^{15}$ atoms-cm$^{-2}$. The ion implantation can be carried out with a 35 angstrom screen oxide (not shown) disposed atop the top surface 404 of the poly layer. After the ion implantation, an anneal is performed to drive in the dopants. The anneal can be performed as an RTA (rapid thermal anneal) "spike" anneal by rapidly increasing the temperature of the substrate to the spike temperature and rapidly decreasing the temperature thereafter. By such ion implantation and RTA spike anneal, a poly layer can be provided which has a substantially uniform dopant concentration throughout its thickness 402.

Figure 5A:
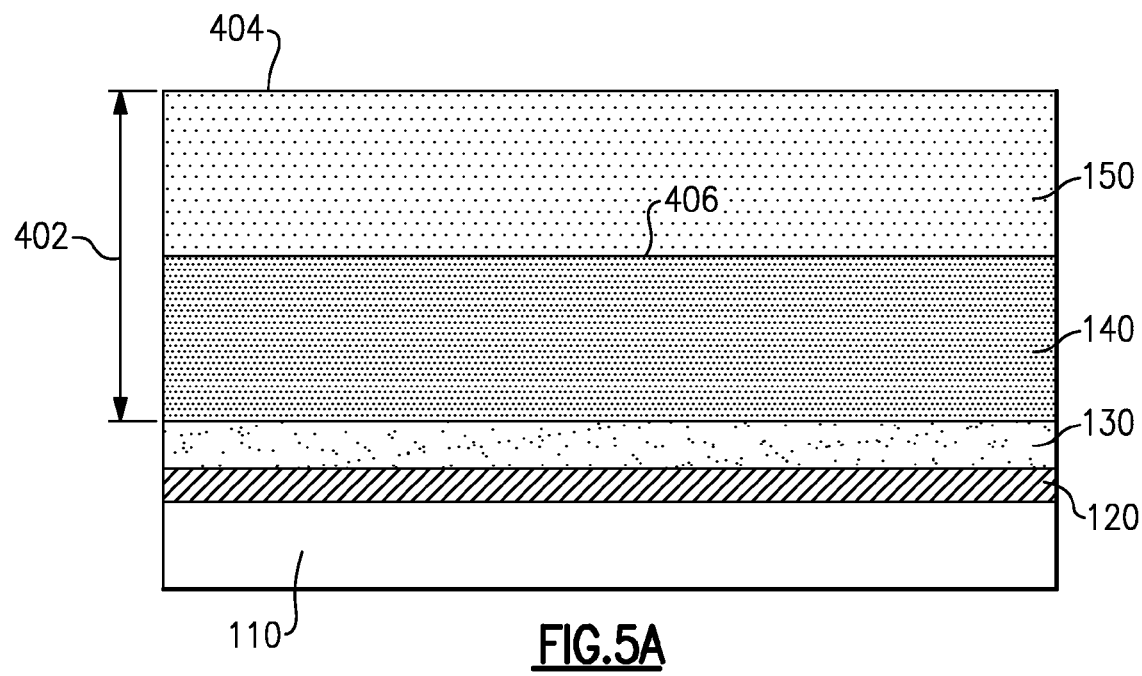
FIG. 5A is a sectional view illustrating a stage subsequent to that shown in FIG. 3 in a method of fabricating a polysilicon resistor in accordance with an embodiment of the invention.

Subsequently, as illustrated in FIG. 5A, a polycrystalline semiconductor region which is doped predominantly n-type (an "n-doped region") 150 can be formed by counterdoping an upper portion of the p-type doped ("p-doped") region such that a portion 140 of the original p-doped polycrystalline semiconductor region 400 (FIG. 4) remains adjacent to the metal gate layer 130 and which remains doped predominantly p-type. In one embodiment, the n-doped region can be formed by implanting arsenic into the p-doped region at an energy of about 2 KeV to 10 KeV and a dose of about $1 \times 10^{15}$ cm$^{-2}$ to about $3\times10^{15}$ cm$^{-2}$. As further seen in FIG. 5B, a boron dopant concentration can be achieved which is nearly constant from a distance of 5 nanometers from a surface 404 of the n-doped region 150 and throughout a combined thickness 402 of the polysilicon regions 140, 150.

Figure 5B:
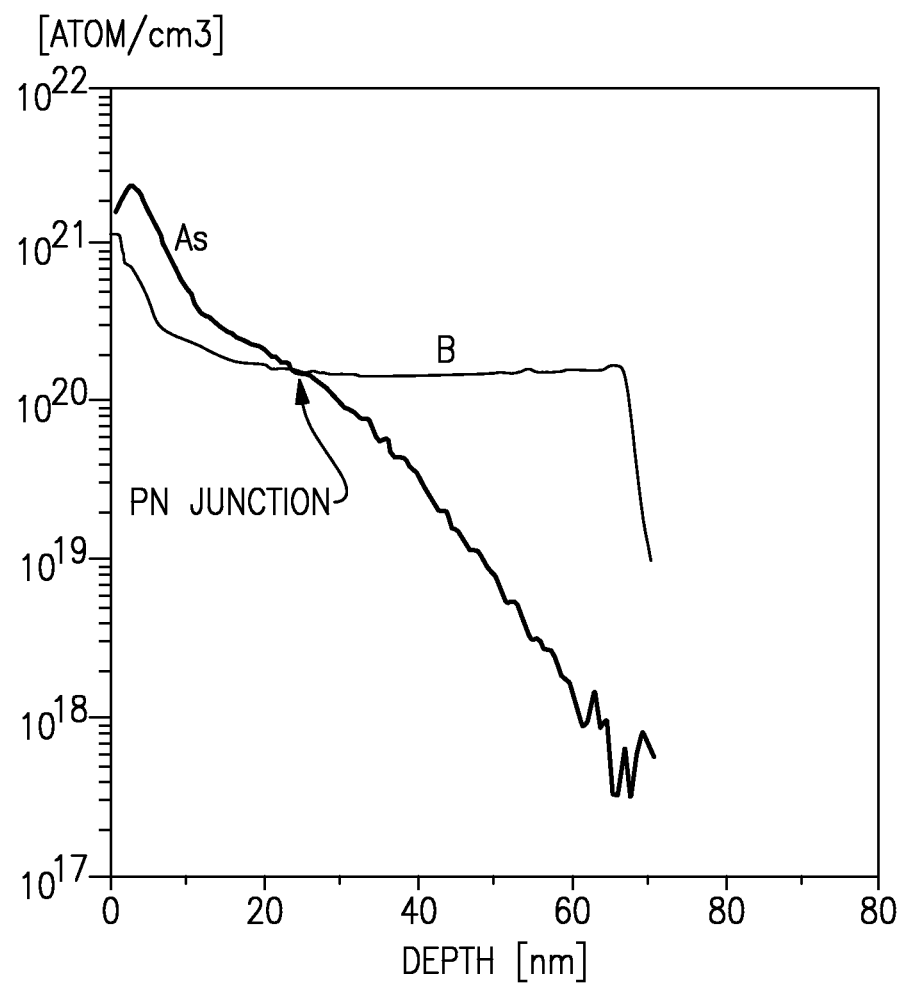
FIG. 5B is a diagram illustrating a dopant profile within a layered stack from which a polysilicon resistor can be formed in accordance with an embodiment of the invention.

After the ion implantation step, an anneal can be performed to drive the arsenic dopant into the n-doped region. In one embodiment, the anneal can be performed using a laser. Laser annealing can be beneficial in this application because it can be used to achieve a dopant concentration in the n-doped region as seen in FIG. 5B which decreases fairly steeply and at a relatively uniform rate with distance from the top surface 404 (FIG. 5A). This can be advantageous for the formation of a p-n junction having a well-defined boundary 406 where the arsenic dopant concentration decreases sharply to fall below the boron dopant concentration.

After forming the layered stack illustrated in FIG. 5A, the electrodes 170 (FIGS. 1, 2A, 2C) can be formed. In one embodiment, the electrodes can include a silicide. In one embodiment, the silicide can be formed by a self-aligned process, particularly when the n-doped region (and typically the p-doped region as well) includes polysilicon. For example, a dielectric layer (not shown) can be deposited over a surface 152 of the n-doped region 150 and then openings can be patterned in the dielectric layer by photolithography to expose only areas 154 of the surface where the electrodes will be formed. Then, a silicide-forming metal can be deposited within the openings of the dielectric layer in contact with the semiconductor material of the n-doped region. The substrate having the layered stack and silicide-forming metal thereon can then be heated to cause at least a portion of the silicide-forming metal within the openings to react with the underlying polysilicon material of the n-doped portion and form a silicide. Portions of the deposited metal which remain unreacted after the silicide is formed can then be removed from the structure, such as by selective etching the metal and cleaning exposed surfaces thereafter.

In a variation of the above electrode-forming process, instead of depositing a metal and causing it to react with the polysilicon to form a silicide as described above, a silicide can be deposited onto portions of the n-doped region 150 which are exposed within openings of a patterned dielectric layer. Portions of the silicide which overlie the dielectric layer then can be removed, such as by etching back or polishing a surface of such dielectric layer.

After forming the silicide, a dielectric layer 190 (FIGS. 2A-C), e.g., an interlevel dielectric (ILD) layer is formed which overlies the electrodes 170. The dielectric layer 190 can include the patterned dielectric layer (not shown) which was used to define the locations of the silicide when forming the electrodes 170. The dielectric layer can have sufficient thickness 192 accommodate a zeroth or first (e.g., "M0" or "M1") metal wiring layer (not shown) and contacts, e.g., conductive vias such as metal vias 165, which connect that wiring layer with appropriate locations, e.g., the silicide regions 170 of the poly resistor.

After forming the dielectric layer 190, holes are patterned in the dielectric layer by photolithography at locations where the conductive vias 165 are to be formed. Then, a conductive material such as a metal, conductive compound of a metal or both, are deposited within the holes to form the conductive vias 165.

Several of the above-described process steps can be performed simultaneously with steps used in forming insulated gate field effect transistors, i.e., "FETs" having metal gates, such as, for example, p-type FETs ("PFETs"), and n-type FETs (NFETs) in accordance with an embodiment of the invention. For example, the layered stack 310 illustrated in FIG. 3 can be deposited to cover both active monocrystalline semiconductor regions (not shown), e.g., monocrystalline silicon regions of a semiconductor substrate such as a wafer, and trench isolation regions or other dielectric regions provided at a major surface of the substrate. As deposited over the monocrystalline semiconductor regions, the layered stack can include an undoped or at most very lightly doped polycrystalline semiconductor region 300 such as seen in FIG. 3. The above-described step of implanting and annealing the deposited polysilicon region 300 (FIG. 3) to provide a p-doped region 400 (FIG. 4) then can be performed simultaneously with a step of implanting and annealing other portions of the polysilicon region 300 (not shown) to form p-doped gates having an appropriate workfunction for use in PFETs fabricated on the same substrate.

The step of implanting arsenic into the p-doped region 400 can also be performed simultaneously with a step of implanting arsenic into other portions of the polycrystalline semiconductor region 300 for forming n-doped gates having an appropriate workfunction for use in NFETs fabricated on the same substrate. However, a similar RTA type anneal could be performed to drive in the arsenic dopant into gates of NFETs being fabricated. This would vary from the above-described use of a laser anneal to selectively drive in the arsenic in the n-doped portion 150.

Alternatively, in one variation, both the steps used to implant and subsequently anneal the n-doped region 150 (FIG. 5A) can vary from those used to form NFETs on the substrate.

It is also possible that steps used to form the electrodes 170 as described above can be performed simultaneously and in a similar manner with steps used to form silicide regions of transistors, e.g., silicide regions contacting doped monocrystalline silicon regions, e.g., source and drain regions, and silicide regions contacting polysilicon regions of gates of NFETs and PFETs being fabricated on the substrate.

It is also possible that steps used to form the conductive vias 165 as described above can be performed simultaneously and in a similar manner with steps used to form conductive vias which at least contact the gates of NFETs and PFETs being fabricated on the substrate, the source and drain regions thereof, or both.

In a variation of the above-described embodiment (FIGS. 1 through 5), the order in which the ion implantation and accompanying anneals are performed can be reversed. In this case, instead of first implanting boron into the poly region 300 (FIG. 3) to form a p-doped region 400 (FIG. 4) having thickness 402, arsenic can be implanted first into the poly region 300, such that a higher arsenic concentration results in locations of the poly region 300 which are at a considerable distance from the metal layer 130. Then, an anneal, for example a laser anneal, can be performed to drive in the arsenic in to form an n-doped region within the poly region 300. Subsequently, the above-described steps of implanting boron and annealing the substrate, such as via an RTA spike anneal, can be performed to define a p-doped region 140 (FIG. 5A) within a lower portion of the poly region 300, the lower portion being adjacent to the metal layer 130.

In another variation, the p-doped region can be formed by in-situ deposition of p-doped polysilicon having a dopant concentration of between about $1\times10^{18}$ cm$^{-3}$ and $2\times10^{20}$ cm$^{-3}$ to form the p-doped layer 140 (FIGS. 2A-C), after which the n-doped region can be formed by in-situ deposition of n-doped polysilicon having a dopant concentration of between about $1\times10^{18}$ cm$^{-3}$ and $2\times10^{20}$ cm$^{-3}$.

In another variation, a p-doped region 400 (FIG. 4) having thickness 402 can be formed by in-situ deposition of p-doped polysilicon having a dopant concentration of between about $1 \times 10^{18}$ cm$^{-3}$ and $2 \times 10^{20}$ cm$^{-3}$, after which the above-described steps of implanting arsenic and subsequent anneal can be performed to define the n-doped region 150 (FIG. 5A) in an upper portion of the thickness 402 of the p-doped region.

In yet another variation of the above-described embodiment (FIGS. 1 through 2C), the positions of the n-type and p-type doped semiconductor regions of the poly resistor 100 above the metal layer can be reversed. In such case, a polycrystalline semiconductor region that is doped predominantly n-type can be disposed adjacent the metal layer 130 and another polycrystalline semiconductor region that is doped predominantly p-type can be spaced from the metal layer 130 by the n-type doped semiconductor region. Again, the metal gate of the poly resistor 100 can be allowed to float or can be electrically clamped to a potential in which the p-n junction formed by the n-type and p-type polycrystalline semiconductor regions is reverse-biased in normal operation.

In addition, the manufacturing method (FIGS. 3 through 5B) can be modified to form a poly resistor having this structure. Specifically, an n-type dopant can be implanted into the deposited polycrystalline semiconductor region 300 (FIG. 3) and the substrate 110 having the layers thereon can be annealed to form a polycrystalline semiconductor region overlying the metal layer 130 which is doped predominantly n-type in place of the predominantly p-type doped semiconductor region 400 shown in FIG. 4. Then, a p-type dopant can be implanted into such n-type polycrystalline semiconductor region to form a predominantly p-type doped polycrystalline semiconductor region in place of the n-type doped semiconductor region 150 shown in FIG. 5A. In such case, a portion of the n-type doped polycrystalline semiconductor region adjacent to the metal layer 130 remains doped predominantly n-type, such portion being an n-type semiconductor region occupying the place of the p-type semiconductor region 140 illustrated in FIG. 5A.

Moreover, the above-described variations of the manufacturing method can also be applied to the method of manufacturing the poly resistor having a predominantly n-type doped polycrystalline semiconductor region overlying the metal layer 130 and adjacent thereto, with the p-type doped polycrystalline semiconductor region adjoining the n-type doped polycrystalline semiconductor region and spaced from the metal layer by the n-type doped polycrystalline semiconductor region. In such case, the dopant types described in the above variations are altered to match the p-doped over n-doped over metal layer structure to be achieved.

Figure 6:
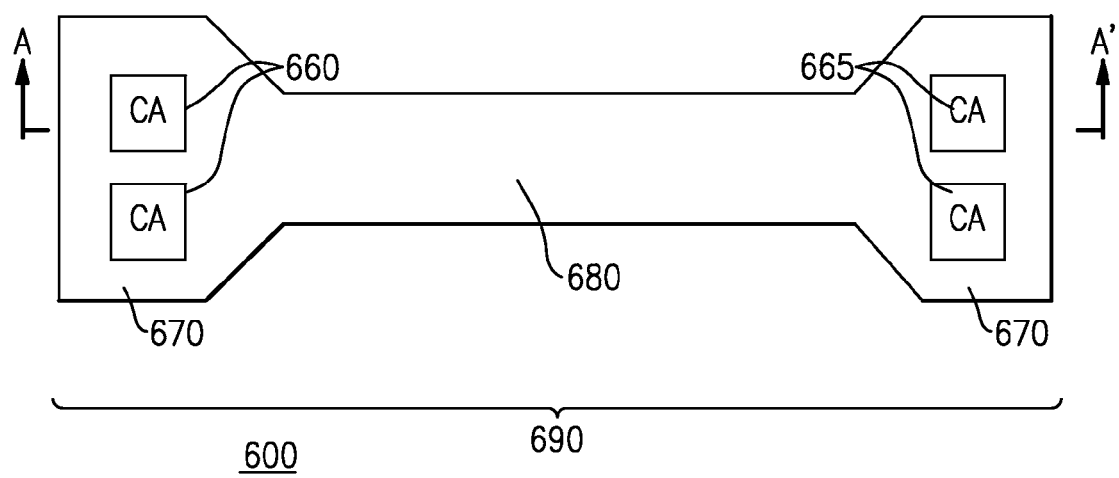
FIG. 6 is a plan view illustrating an electrical fuse in accordance with an embodiment of the invention.
Figure 7:
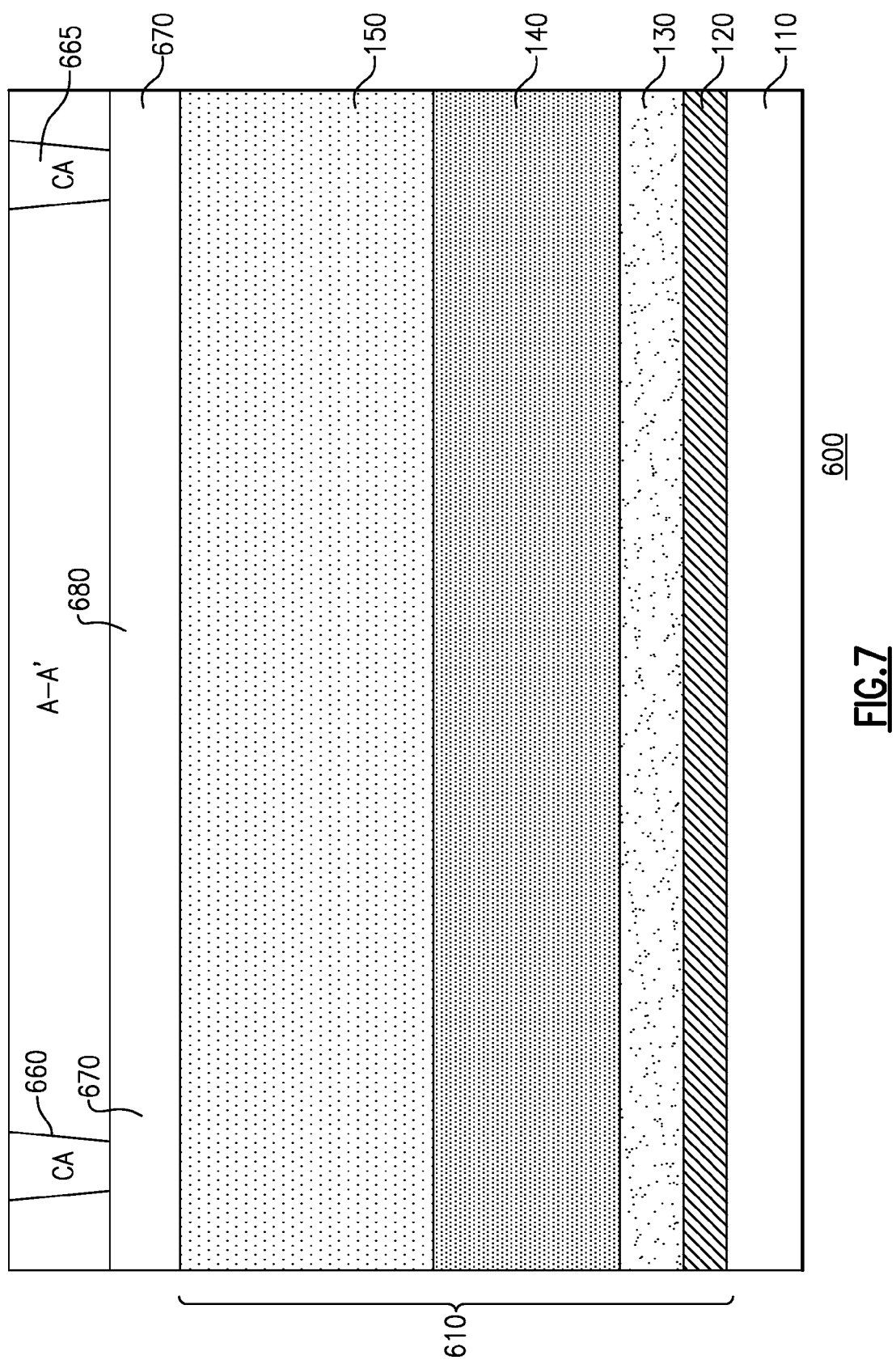
FIG. 7 is a sectional view of the electrical fuse through line A-A' of FIG. 6.

In one important variation, steps of the above-described process can be performed to fabricate an electrical fuse 600 (FIGS. 6-7) while simultaneously performing steps needed to fabricate metal gated transistors such as NFETs and PFETs as described above. As seen in FIG. 6, an electrical fuse can include a conductive element including a silicide region 690 which includes first and second contacts, e.g., electrodes 670 at ends thereof and a fusible element 680 between the first and second electrodes. As seen in the sectional view of FIG. 7, the silicide region 680 of the electrical fuse can be formed on a layered stack 610 which includes each of the same underlying regions and layers 110, 120, 130, 140, and 150 as described above with reference to FIG. 5A.

The electrical fuse 600 can be fabricated using the same steps as described above (FIGS. 1 through 5), except that when forming the silicide region 690, a dielectric layer (not shown) overlying the n-doped region 150 can be patterned with an appropriate size and shape to define a silicide region 690 as seen in FIG. 6. Thus, the fusible element 680 of the silicide region 690 can be formed integrally with the electrodes 670 by the above-described process used to form the electrodes 170 of the poly resistor 100 (FIGS. 1-2), e.g., using the above-described self-aligned silicide process or masked silicide deposition process.

As in the case of the poly resistor 100, the electrical fuse 600 can be fabricated by steps employed to simultaneously fabricate metal gate FETs and PFETs on the same substrate, in a manner as described above for the poly resistor. In addition, the electrical fuse 600 can be fabricated by steps employed to simultaneously fabricate a poly resistor 100 on the same substrate. Here again, when forming the silicide region 690 of the electrical fuse 600, a dielectric layer (not shown) overlying the n-doped region 150 can be patterned with an appropriate size and shape to define a silicide region 690 as seen in FIG. 6.

In accordance with a variation, as in the case with the poly resistor, the positions of the n-type and p-type doped semiconductor regions of the electrical fuse above the metal layer can be reversed. Specifically, a polycrystalline semiconductor region that is doped predominantly n-type can be disposed adjacent the metal layer 130 and another polycrystalline semiconductor region that is doped predominantly p-type can be spaced from the metal layer 130 by the n-type doped semiconductor region. The manufacturing method can be varied in the same manner as described above for the poly resistor 100 (FIGS. 1-2C) in order to achieve the p-doped over n-doped over metal layer structure.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:
1. A method of making a resistive polycrystalline semiconductor device of a microelectronic element, comprising:
(a) forming a layered stack including a dielectric layer contacting a surface of a monocrystalline semiconductor region of a substrate, a metal gate layer overlying the dielectric layer, a first polycrystalline semiconductor region adjacent the metal gate layer, and a second polycrystalline semiconductor region spaced from the metal gate layer by the first polycrystalline semiconductor region and adjoining the first polycrystalline semiconductor region, the first polycrystalline semiconductor region having a first predominant dopant type being either p or n, and the second polycrystalline semiconductor region having a second predominant dopant type being either p or n and being opposite the first predominant dopant type; and
(b) forming first and second contacts in conductive communication with the second polycrystalline semiconductor region, the first and second contacts being spaced apart so as to achieve a desired resistance;
wherein step (a) further includes forming a polycrystalline semiconductor region then implanting a p-type dopant into the polycrystalline semiconductor region and annealing to form the first polycrystalline semiconductor region adjacent to the metal gate layer and having the p-type predominant dopant type wherein the p-type dopant is substantially uniformly distributed in the first polycrystalline semiconductor region, and then implanting an n-type dopant into the polycrystalline semiconductor region and performing laser annealing to form the second polycrystalline semiconductor region having the n-type predominant dopant type.

2. A method as claimed in claim 1, wherein step (a) includes depositing the polycrystalline semiconductor region onto the metal gate layer, and then defining the first and second polycrystalline semiconductor regions from the polycrystalline semiconductor region.

3. A method as claimed in claim 1, further comprising forming electrodes including a silicide, wherein step (b) includes forming the first and second contacts to include conductive vias electrically contacting the silicide.

4. A method as claimed in claim 3, further comprising depositing a metal onto first and second exposed spaced apart portions of a surface of the second polycrystalline semiconductor region and applying heat thereto to cause the metal to react with semiconductor material therein to form first and second electrodes, the electrodes being spaced apart in a direction of the second polycrystalline semiconductor region.

5. A method as claimed in claim 2, further comprising forming a layered gate stack for at least one transistor by steps including forming a metal gate layer and depositing a polycrystalline semiconductor material thereon, said metal gate layer and said depositing being performed simultaneously when forming the layered stack in step (a).

6. A method as claimed in claim 5, further comprising forming a contact electrically connected to a polycrystalline semiconductor portion of the transistor, wherein the forming of the contact is performed simultaneously with step (b).

7. A method of making an electrical fuse element of a microelectronic element, comprising: (a) forming a layered stack including a dielectric layer contacting a surface of a monocrystalline semiconductor region of a substrate, a metal gate layer overlying the dielectric layer, a first polycrystalline semiconductor region adjacent the metal gate layer, and a second polycrystalline semiconductor region spaced from the metal gate layer by the first polycrystalline semiconductor region and adjoining the first polycrystalline semiconductor region, the first polycrystalline semiconductor region having a first predominant dopant type being either p or n, and the second polycrystalline semiconductor region having a second predominant dopant type being either p or n and being opposite from the first predominant dopant type, and a silicide region extending over at least a portion of the second polycrystalline semiconductor region; and (b) forming first and second spaced-apart contacts in conductive communication with the silicide region, wherein at least a portion of the silicide region extends continuously between the first and second contacts and is electrically connected with each of first and second contacts;

wherein step (a) further includes forming a polycrystalline semiconductor region then implanting a p-type dopant into the polycrystalline semiconductor region and annealing to form the first polycrystalline semiconductor region adjacent to the metal gate layer and having the p-type predominant dopant type, wherein the p-type dopant is substantially uniformly distributed in the first polycrystalline semiconductor region, and then implanting an n-type dopant into the polycrystalline semiconductor region and performing laser annealing to form the second polycrystalline semiconductor region having the n-type predominant dopant type.

8. A method as claimed in claim 7, wherein step (a) includes depositing the polycrystalline semiconductor region onto the metal gate layer, and then defining the first and second polycrystalline semiconductor regions from the polycrystalline semiconductor region.

9. A method as claimed in claim 7, wherein the forming of the silicide in step (a) includes depositing a metal onto a surface of the second polycrystalline semiconductor region and applying heat thereto to cause the metal to react with semiconductor material therein.

10. A method as claimed in claim 7, further comprising forming a layered gate stack for at least one transistor by steps including forming a metal gate layer and depositing a polycrystalline semiconductor material thereon, said metal gate layer and said depositing being performed simultaneously when forming the layered stack in step (a).

11. The method of claim 1, wherein forming the second polycrystalline semiconductor region having the n-type predominant dopant type comprises forming the second polycrystalline semiconductor region with a dopant profile that decreases by about one order of magnitude per 20 nanometers of depth.

12. The method of claim 11, wherein the n-type predominant dopant type is comprised of arsenic.

13. The method of claim 1, wherein forming the first polycrystalline semiconductor region having the p-type predominant dopant type comprises forming the first polycrystalline semiconductor region with a dopant profile that is nearly constant from a distance of five nanometers from a surface of the second polycrystalline semiconductor region.

14. The method of claim 13, wherein the p-type predominant dopant type is comprised of boron.

15. The method of claim 7, wherein forming the second polycrystalline semiconductor region having the n-type predominant dopant type comprises forming the second polycrystalline semiconductor region with a dopant profile that decreases by about one order of magnitude per 20 nanometers of depth.

16. The method of claim 7, wherein forming the first polycrystalline semiconductor region having the p-type predominant dopant type comprises forming the first polycrystalline semiconductor region with a dopant profile that is nearly constant from a distance of five nanometers from a surface of the second polycrystalline semiconductor region.

* * * * *